United States Patent
Gaillard et al.

(10) Patent No.: US 6,875,558 B1
(45) Date of Patent: Apr. 5, 2005

(54) INTEGRATION SCHEME USING SELF-PLANARIZED DIELECTRIC LAYER FOR SHALLOW TRENCH ISOLATION (STI)

(75) Inventors: Frederic Gaillard, Voiron (FR); Fabrice Geiger, St. Nazaire les Eymes (FR); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 239 days.

(21) Appl. No.: 10/049,689

(22) PCT Filed: Aug. 16, 2000

(86) PCT No.: PCT/US00/22561

§ 371 (c)(1),
(2), (4) Date: Sep. 5, 2002

(87) PCT Pub. No.: WO01/13420

PCT Pub. Date: Feb. 22, 2001

(30) Foreign Application Priority Data

Aug. 16, 1999 (EP) .............................................. 99402068

(51) Int. Cl.$^7$ ................................................. G03F 7/00
(52) U.S. Cl. .................................. 430/311; 427/255.28
(58) Field of Search ............................... 430/311–313; 427/255.28; 438/257, 260, 424, 786

(56) References Cited

U.S. PATENT DOCUMENTS

| 5,786,262 A | 7/1998 | Jang et al. |
| 5,886,391 A | 3/1999 | Niroomand et al. |
| 5,930,644 A | 7/1999 | Tsai et al. |
| 5,949,126 A * | 9/1999 | Dawson et al. ............. 257/513 |
| 5,956,584 A * | 9/1999 | Wu ............................ 438/232 |

FOREIGN PATENT DOCUMENTS

| EP | 0 819 786 A2 | 1/1998 |
| EP | 0 908 938 A2 | 4/1999 |

* cited by examiner

*Primary Examiner*—Mark F. Huff
*Assistant Examiner*—Kripa Sagar
(74) *Attorney, Agent, or Firm*—Townsend and Townsend and Crew

(57) ABSTRACT

A method for forming a trench isolation structure on a substrate. The method includes applying a pad oxide layer (226) on the substrate (224), applying a polysilicon layer (228) over the pad oxide layer, and applying a CVD anti-reflective coating (ARC) (230) over the polysilicon layer. A photoresist is formed on the CVD ARC and a trenched is etched at a desired location. One embodiment provides a method for depositing a trench oxide filling layer (300) on the trenched substrate utilizing the surface sensitivity of dielectric materials such as $O_3$/TEOS to achieve a substantially self-planarized dielectric layer. Prior problems with porous trench fill, particular near trench corners, are obviated by use of the polysilicon layer. After deposition, an oxidizing anneal can be performed to grow a thermal oxide (307) at the trench surfaces and densify the dielectric material. A chemical mechanical polish can be used to remove the excess oxide material, including the porous regions.

25 Claims, 15 Drawing Sheets

INTEGRATION SCHEME USING SELF-PLANARIZED DIELECTRIC LAYER FOR SHALLOW TRENCH ISOLATION (STI)

BACKGROUND OF THE INVENTION

The present invention relates to the fabrication of integrated circuits. More particularly, the present invention is directed toward methods for providing self-planarized deposition of high quality dielectric layers for shallow trench isolation.

Semiconductor device geometries continue to decrease in size, providing more devices per unit area on a fabricated wafer. These devices are typically initially isolated from each other as they are built into the wafer, and they are subsequently interconnected to create the specific circuit configurations desired. Currently, some devices are fabricated with feature dimensions as small as, or smaller than, 0.18 µm. For example, spacing between devices such as conductive lines or traces on a patterned wafer may be separated by 0.18 µm leaving recesses or gaps of a comparable size. A nonconductive layer of dielectric material, such as silicon dioxide ($SiO_2$), is typically deposited over the features to fill the aforementioned gaps and insulate the features from other features of the integrated circuit in adjacent layers or from adjacent features in the same layer.

Dielectric layers are used in various applications including shallow trench isolation (STI) dielectric for isolating devices and interlayer dielectric (ILD) formed between metal wiring layers or prior to a metallization process. In some cases, STI is used for isolating devices having feature dimensions of 0.5 µm or smaller. Planarization of dielectric layers has become increasingly important as the packing densities of semiconductor devices continue to grow.

The planarization issue is described using an example of a typical process for forming a shallow trench isolation (commonly referred to as STI integration) as illustrated in FIGS. 1A–1G. In FIG. 1A, a silicon substrate 110 has deposited thereon a pad oxide layer 112 and a nitride layer 114 such as silicon nitride. The nitride layer 114 is typically deposited by low pressure chemical vapor deposition (LPCVD), and serves as an etch stop for chemical mechanical polishing (CMP). Referring to FIG. 1B, a bottom anti-reflective coating (BARC) 116 is formed above the nitride layer 114 for absorbing light reflected from the substrate 110 during photolithography. Typically an organic spin-on glass (SOG), the BARC 116 is needed typically for light having wavelengths of below about 248 nm, including deep ultraviolet (DUV) and far ultraviolet (FUV) light. A photoresist 118 is formed over the BARC 116 and exposed using a mask (not shown) which defines the location of the trenches. The exposed photoresist is then stripped to leave open areas for forming the trenches. Typically, a plasma etch is performed to etch the open areas through the nitride 114, pad oxide 112, and silicon substrate 110 to form the trenches 120, as shown in FIG. 1C. After the remaining photoresist 118 and BARC 116 are removed, a thermal oxide 122 is typically grown on the nitride/pad oxide and on the surfaces of the trenches 120 (trench bottom 124 and trench wall 126) to repair the plasma damage to the silicon substrate 110, as illustrated in FIG. 1D.

A dielectric layer 128 is then deposited over the thermal oxide 122 to fill the trenches 120 and cover the nitride layer 114. This dielectric layer 128 is often referred to as a trench oxide filling layer. Typical dielectric layers are formed from oxide materials such as silicon dioxide or silicate glass. As shown in FIG. 1E, the surface profile of the deposited dielectric layer 128 is stepped and generally resembles the shape of the trenched substrate 110. The surface profile is more uniform in dense fields with closely space narrow trenches than in open fields with wide trenches. As seen in FIG. 1E, a step height 130 is formed in the dielectric profile between the dense field 134 and the open field 132. Because of the step height 130, it is not practicable to apply CMP directly after the dielectric layer deposition step to planarize the dielectric layer 128 because otherwise a dishing effect in the open field 132 will result with CMP, as seen in FIG. 1H. Instead, a reverse mask and etch procedure is used to etch the extra oxide to obtain a more planar surface profile as illustrated in FIG. 1F. This procedure typically involves the steps of photoresist deposit, reverse masking, cure, etched photoresist removal, etchback, and removal of remaining photoresist. A CMP procedure is then applied to the structure of FIG. 1F to globally planarize the surface of the filled substrate 110 as shown in FIG. 1G. The reverse mask and etch procedure necessitated by the step height effect adds significant cost and complexity (for example, due to the added lithography steps involved) to the planarization procedure.

From the discussion above, it is seen that multiple steps, including additional photolithography steps (which require expensive equipment), are needed to provide STI. However, it is desirable to reduce the number of steps (and related equipment, especially photolithography equipment which requires expensive lenses, light sources, etc.) and to obtain improved results in order to provide a more economic and efficient manufacturing process. For example, one way to obtain improved results is to provide a self-planarized, high quality trench oxide filling layer at a reduced cost.

A number of procedures are known for depositing dielectric layers such as the gap-fill dielectric 128 for the trench oxide filling layer in the example shown in FIG. 1E. One type of process employs $O_3$ (ozone) and TEOS (tetraethylorthosilicate) for depositing a dielectric film such as silicate glass. Such films deposited are commonly referred to as "$O_3$/TEOS films". $O_3$/TEOS processes have a surface sensitivity which increases as the $O_3$/TEOS ratio increases. Due to the surface sensitivity, the dielectric deposition rate varies in accordance with the properties of the material of the underlying layer.

It is known to minimize the surface sensitivity by depositing a surface insensitive barrier layer prior to the $O_3$/TEOS film deposition. One known method is to lower the surface sensitivity by decreasing the $O_3$/TEOS ratio and/or decreasing the pressure. However, lowering the $O_3$/TEOS ratio tends to undesirably result in a more porous dielectric film. This is particularly problematic when the dielectric film is used for isolation purposes. One way to address this concern has been to raise the process temperature to above about 500 degrees Celsius, but raising the process temperature is often undesirable. Alternatively, an additional anneal process after the deposition of the trench oxide filling layer has been used to densify the trench oxide filling layer. This method, however, suffers from the need to perform an extra step.

Instead of minimizing the surface sensitivity, some have utilized the deposition rate dependence of $O_3$/TEOS films to perform gap fill for a trenched silicon substrate wherein the side walls of the trench are covered with thermal oxide spacers. Using an atmospheric pressure CVD (APCVD) $O_3$/TEOS deposition and an ozone concentration of 5%, it was reported that faster film growth on the bottom silicon than on the side wall spacers precluded void formation to achieve void-free gap fill. Others have investigated the feasibility of forming a planarized intermetal dielectric (IMD) by taking advantage of the surface sensitivity of O$_3$/TEOS and similar materials such as O$_3$-octamethylcyclotetrasiloxane (OMTC). Researchers have reported difficulties of controlling the different deposition rates to achieve planarity. For instance, significant elevations have been observed at the edges of aluminum metal lines caused by the different deposition rates of the O$_3$/TEOS on a TiN ARC layer on top of the aluminum and the aluminum side walls. Some of these same researchers have reported more satisfactory planarization results for depositing SiO$_2$ layers on an aluminum interconnect built upon a phosphorus glass (PSG) level using O$_3$—OMTC.

In investigating sub atmospheric chemical vapor deposition (SACVD) of TEOS/O$_3$ for self-planarized shallow trench isolation (STI) applications, the inventors also encountered difficulties in trench fill quality. As shown in FIG. 2A, porous regions 140 developed in the trench fill dielectric generally adjacent the nitride layer. It is believed these regions 140 were caused by faster deposition rates (up to 5 times faster) of TEOS/O$_3$ on the silicon substrate (i.e., the trench bottom and walls) than on nitride layer 114.

After CMP of nitride layer 114 and pad oxide 112, the trench fill material 128 is undercut near the trench corners as shown in FIG. 2B. The eroded trench corners 142 may lead to an undesirable electrostatic field between adjacent active regions notwithstanding the underlying STI.

What is needed are more efficient and economic methods for self-planarized deposition of a high quality trench oxide filling layer for shallow trench isolation integration. Improved methods of effectively utilizing the deposition rate dependence of dielectric materials such as O$_3$/TEOS films are also desired. It also would be desirable to provide self-planarized STI without the corner erosion problems depicted in FIG. 2.

SUMMARY OF THE INVENTION

Specific embodiments of the present invention provide more efficient methods for providing shallow trench isolation integration by forming self-planarized, high quality trench fill layers using surface sensitive dielectric materials. The invention does so by depositing a polysilicon layer prior to etching the isolation trenches. The polysilicon layer moves the porous regions of subsequently deposited trench fill materials away from the trench, thereby improving trench fill quality. An optional trench cleaning step can be used prior to deposition to further improve the quality of the trench fill layers and the electrical characteristics of the device.

One embodiment of the invention is directed to a method for forming a trench isolation structure on a substrate. The method includes applying a pad oxide layer on the substrate, applying a polysilicon layer over the pad oxide layer, and applying a CVD anti-reflective coating (ARC) over the polysilicon layer. A photoresist is formed on the CVD ARC. A portion of the photoresist then is exposed to a light to define a location where a trench is to be formed, and the photoresist is removed at that location. The method includes etching, at the location, through the CVD ARC, polysilicon layer, pad oxide and through a depth of the substrate to form a trench having a trench bottom.

In one aspect, the trench then is filled by introducing a precursor into a substrate processing chamber containing the substrate and flowing ozone into the substrate processing chamber to react with the precursor to deposit a dielectric layer over the substrate. An ozone/precursor ratio is adjusted to regulate deposition rates of the dielectric layer on the trench bottom and the CVD ARC until the dielectric layer develops a substantially planar dielectric surface. In still another aspect, the substrate is subjected to an oxygen-containing gas and heated to substantially simultaneously densify the dielectric layer and to form a thermal oxide at an interface between the dielectric layer and a surface of the trench.

According to yet another embodiment, a method for forming a trench isolation structure on a substrate includes the step of applying a pad oxide layer on the substrate, applying a polysilicon layer over the pad oxide layer, and applying a nitride layer over the polysilicon layer. A bottom anti-reflective coating (BARC) is applied over the polysilicon layer and a photoresist is formed on the BARC. A portion of the photoresist is exposed to a light to define a location where a trench is to the formed. The photoresist is removed at the location. The method further includes the step of etching, at the location, through the BARC, the nitride layer, the polysilicon layer, the pad oxide and through a depth of the substrate to form a trench at the location.

For a further understanding of the objects and advantages of the present invention, reference should be made to the ensuing detailed description taken in conjunction with the accompanying drawings.

DESCRIPTION OF THE SPECIFIC EMBODIMENTS

I. Self-Planarized Deposition of a Dielectric Layer in Shallow Trench Integration Specific embodiments of the present invention are illustrated using an STI integration as an example. The benefits of the various embodiments of the invention can be readily seen by comparison with the prior art methods, such as illustrated in FIGS. 1A–1H. Specifically, the present invention provides more efficient shallow trench isolation integration by providing self-planarized deposition of a dielectric trench fill layer without sacrificing the quality of the dielectric layer. The present invention further provides dielectric trench fill layers which have undesirable porous regions removed by CMP. It is understood that the scope of the invention is not necessarily limited to STI integration.

A. Forming a Trench

Figure 3A:
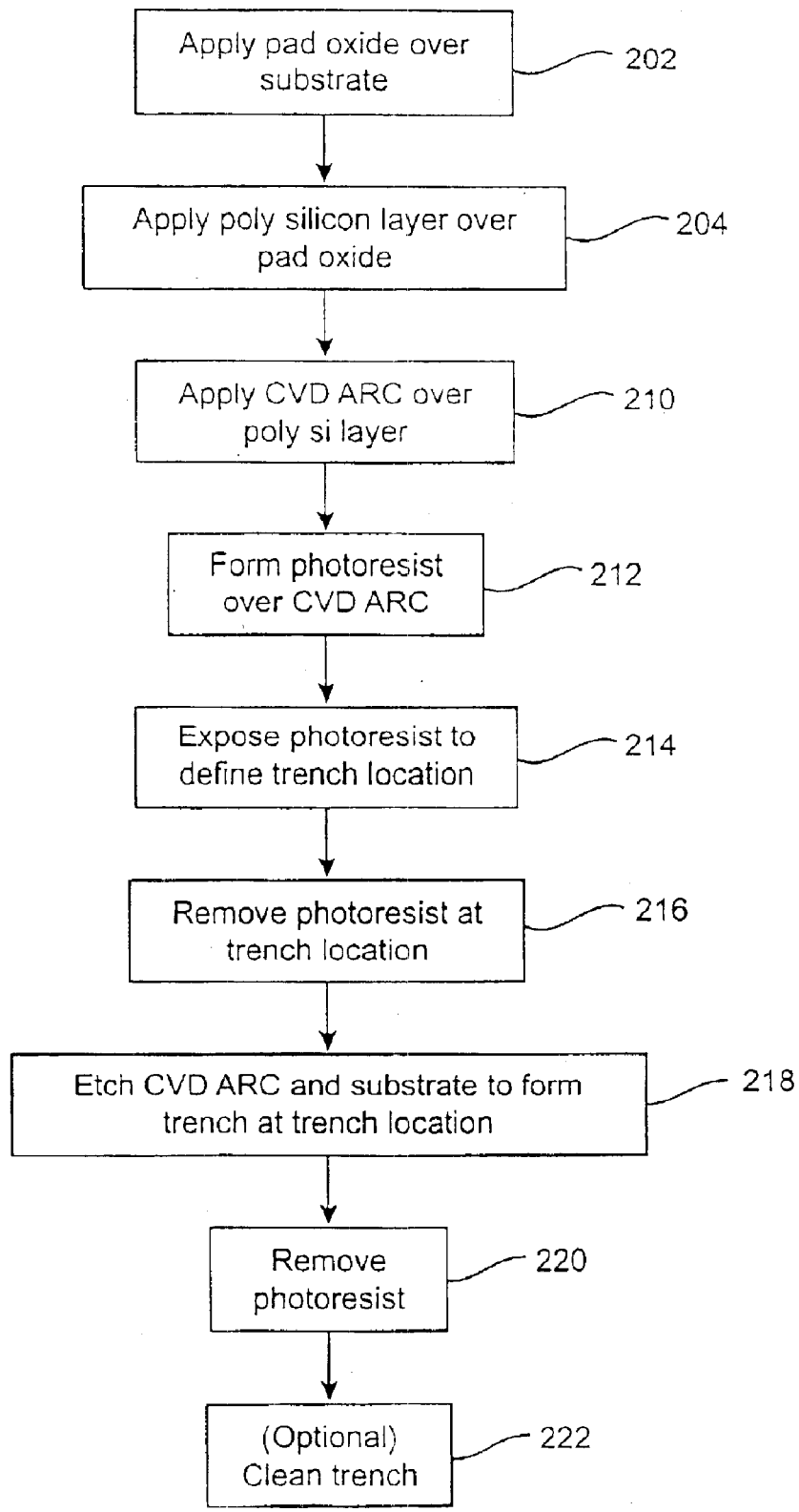
FIGS. 3A and 3B are flow diagrams of alternate embodiments of the method of forming a trench in accordance with the present invention.
Figure 3B:
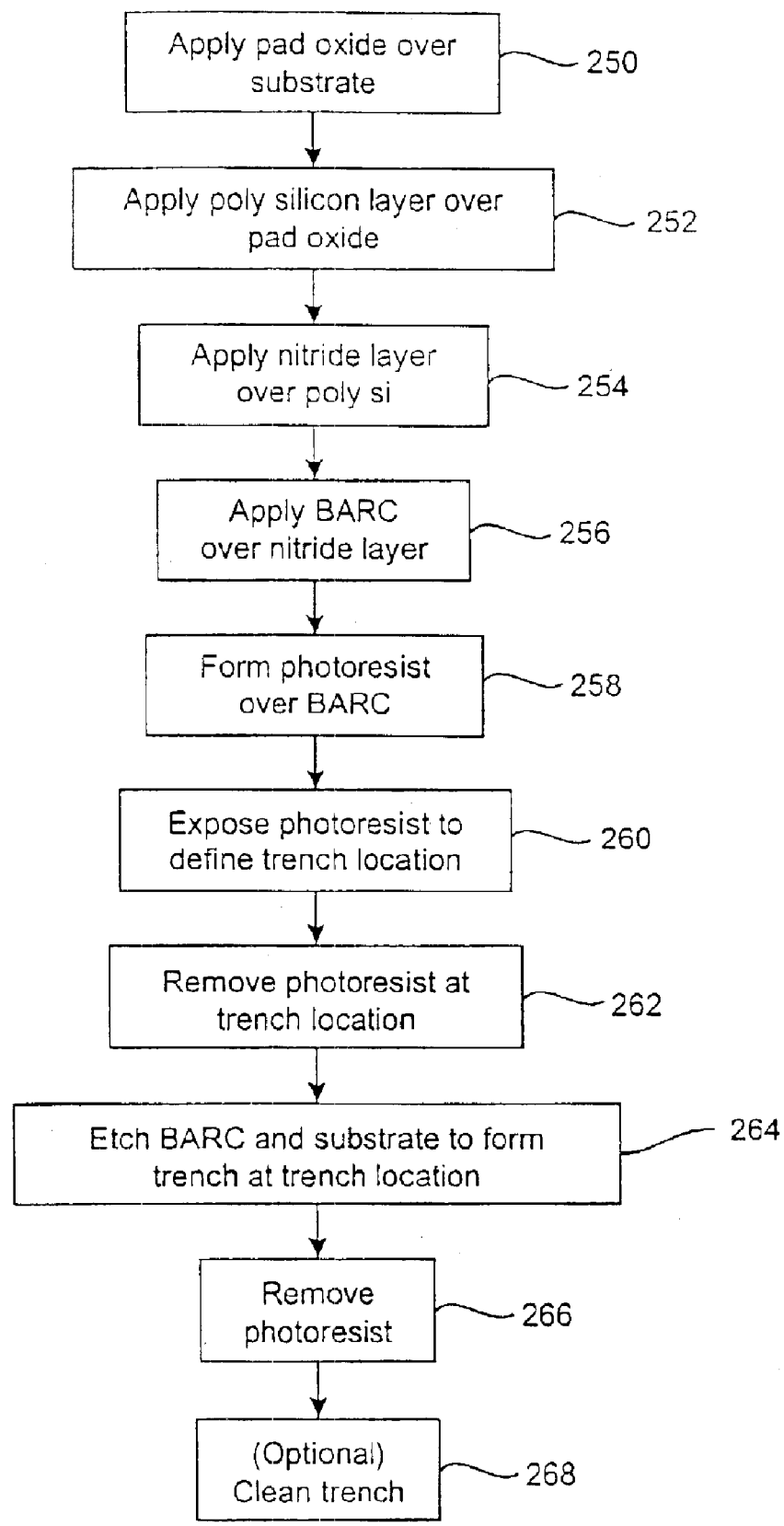

FIGS. 3A and 3B illustrate alternate methods of forming a trench on a substrate, typically a silicon substrate. Referring to FIG. 3A, the first step 202 is to apply a pad oxide directly on the silicon substrate. In one particular embodiment, pad oxide is about 60 Angstroms (Å) thick, although other thicknesses may be used. Pad oxide operates to protect the underlying substrate, particularly from stresses caused by subsequently deposited nitride layers. Next, a polysilicon layer is deposited over the pad oxide layer in step 204. In one embodiment, polysilicon layer is about 400 Å–1000 Å thick, and in one particular embodiment is about 600 Å thick. The purpose and function of the polysilicon layer is described in further detail below. Step 210 is to apply a CVD anti-reflective coating (CVD ARC) directly to the polysilicon layer. Unlike the commonly used organic spin on BARC, CVD ARC is an inorganic material that typically includes, for example, silicon nitride, silicon oxynitride, or silicon carbide. The CVD ARC is deposited by promoting chemical reaction of the process gases in a CVD system. For example, a CVD ARC which includes silicon, and nitrogen and/or oxygen (also known as a dielectric ARC or DARC) is deposited by introducing the following process gases in plasma-enhanced CVD (PECVD): a silicon-containing gas (such as silane or TEOS), and a nitrogen-containing gas and/or an oxygen-containing gas. Nitrous oxide ($N_2O$) may be used for supplying nitrogen and oxygen, but other sources of oxygen and nitrogen can of course be used. An inert gas such as helium or argon is typically used for controlling the deposition rate of the process and the film thickness, and for stabilizing the process.

An example of a suitable CVD apparatus is described in U.S. Pat. No. 5,558,717 entitled "CVD PROCESSING CHAMBER," issued to Zhao et al. The gas ratio can be adjusted to obtain a film composition with the desired optical characteristics (refractive index and absorptive index) of the deposited CVD ARC. A CVD ARC silicon nitride layer differs from the conventional LPCVD silicon nitride layer in that the film composition of the LPCVD silicon cannot be modified because LPCVD is a thermal process rather than a plasma-enhanced process. Some of the techniques that can be used to deposit CVD ARC are described in U.S. patent application Ser. No. 08/672,888 entitled "METHOD AND APPARATUS FOR DEPOSITING ANTIREFLECTIVE COATING," having David Cheung, Joe Feng, Judy H. Huang, and Wai-Fan Yau as inventors; U.S. patent application Ser. No. 08/852,787 entitled "METHOD AND APPARATUS FOR DEPOSITING AN ETCH STOP LAYER," having Judy H. Huang, Wai-Fan Yau, David Cheung, and Chan-Lon Yang as inventors; and "Novel ARC Optimization Methodology for KrF Excimer Laser Lithography at Low K1 Factor" by Tohru Ogawa, Mitsunori Kimura, Yoichi Tomo, and Toshiro Tsumori, published in the SPIE Proceedings (Optical/Laser Microlithography V), Volume 1674, pages 362–375 (1992). The two applications are assigned to Applied Materials, Inc., the assignee of the present invention. Each of these references are incorporated herein by reference.

In one embodiment, a desired ratio of silane ($SiH_4$) to $N_2O$ is selected for depositing a DARC. In addition, $N_2$ and $NH_3$ are introduced to further control the optical and chemical properties of the DARC deposited. The effects of $N_2$ and $NH_3$ are particularly dominant in process regimes where $SiH_4$ and $N_2O$ have minimal or no effect on the DARC properties, e.g., at low temperature. The addition of $NH_3$ and $N_2$ in the process further changes the composition of the film, allowing more freedom and finer tuning of the refractive index and the absorptive index. Furthermore, the process is compatible with the use of helium, which is more cost-effective than argon. Helium also allows for improved stress control of the DARC layer deposited. This helps prevent the film from becoming too tensile, which can cause it to flake off the substrate after deposition.

Figure 1A:
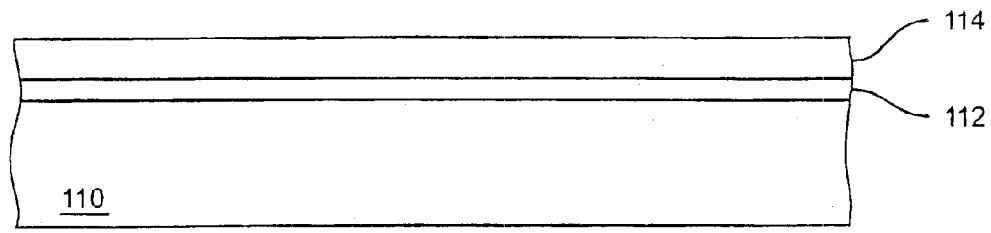
FIGS. 1A–1H are side cross-sectional views of a substrate demonstrating trench formation and trench fill by a dielectric material employing prior art deposition methods.
Figure 1B:
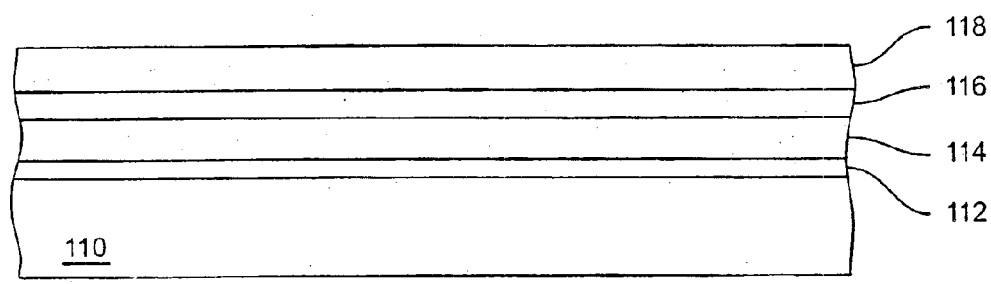
Figure 1C:
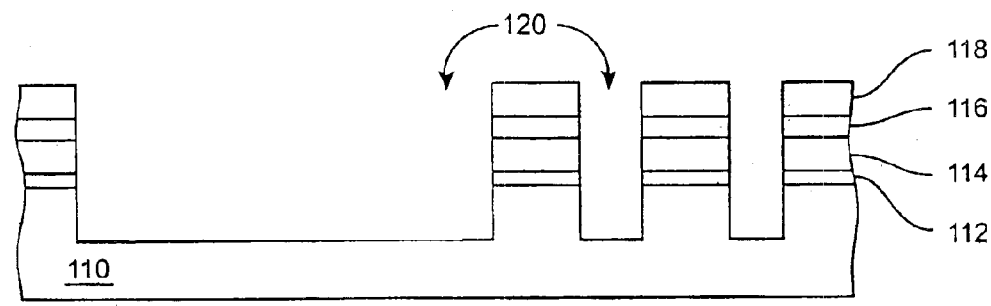
Figure 1D:
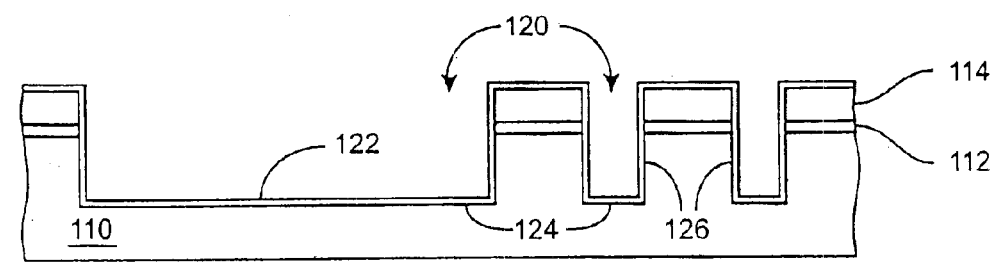
Figure 1E:
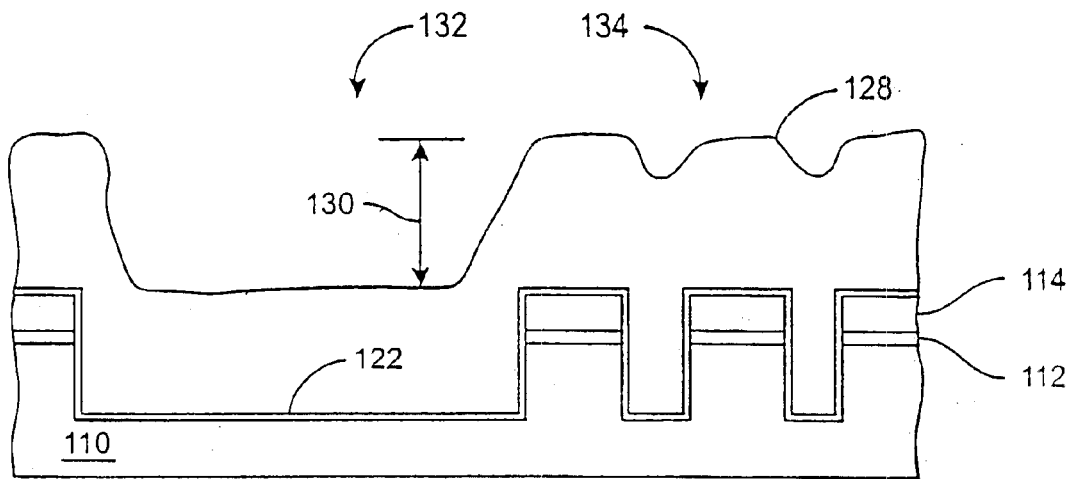
Figure 1F:
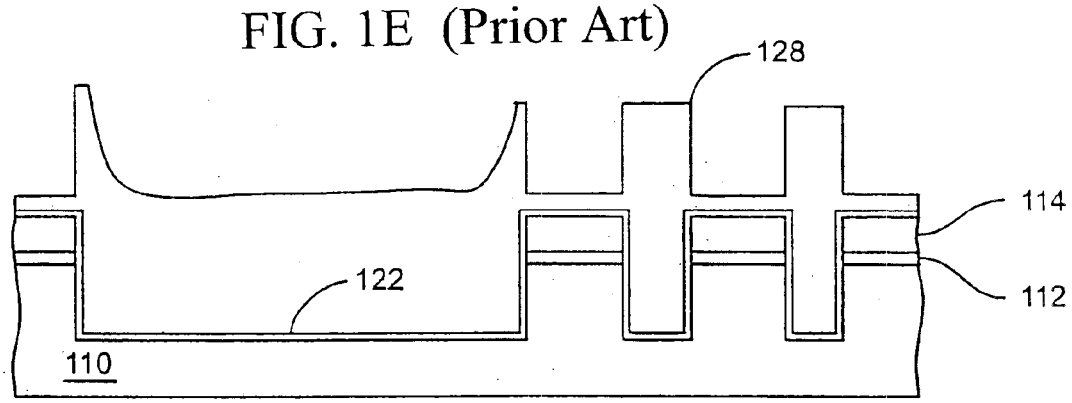
Figure 1G:
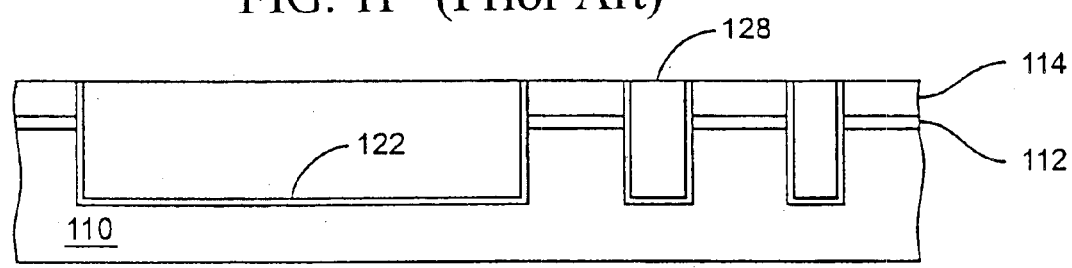
Figure 1H:
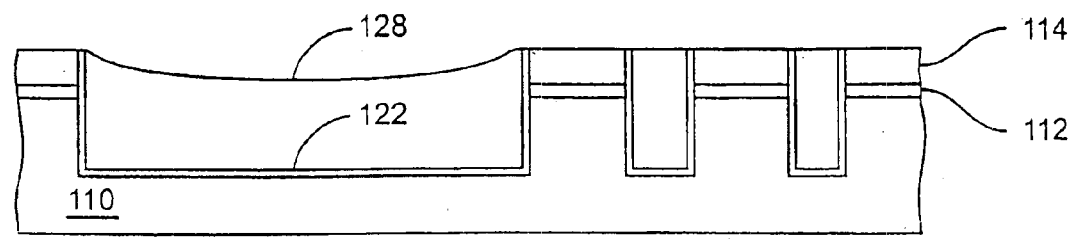

The CVD ARC has the ability to absorb light reflected from the substrate during photolithography similar to the BARC (FIG. 1B). In addition, the CVD ARC has a reflective property that allows it to reflect light that is out-of-phase from light reflected from the substrate so that the two cancel each other in what is referred to as a phase shift cancellation. The CVD ARC serves photolithography and, if desired, CMP purposes. CVD ARC also is a good barrier to oxygen diffusion. In one particular embodiment, the CVD ARC is used as an etch stop for CMP, making it possible to eliminate the LPCVD nitride layer (FIG. 1G), as mentioned above.

Figure 4A:
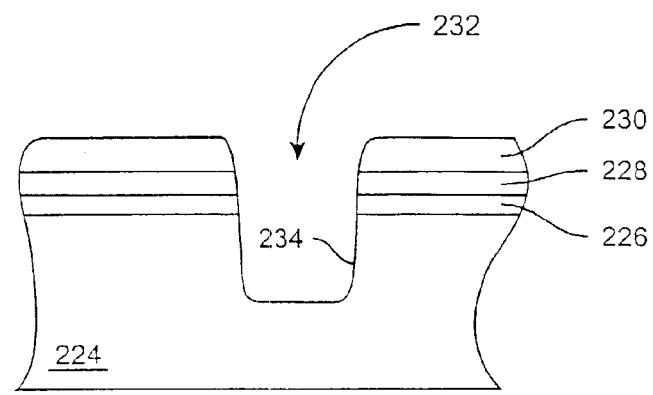
FIGS. 4A and 4B are side cross-sectional views of alternate embodiments of a trenched substrate according to the present invention.

Referring again to FIG. 3A, a photoresist is formed over the CVD ARC at step 212. The photoresist is exposed to define the trench location where the trench is to be formed (step 214) and the exposed photoresist is then stripped at the trench location (step 216) according to a specific embodiment. An etching step 218 is performed to etch the CVD ARC, the polysilicon layer, pad oxide and silicon substrate to form the trench at the trench location. At step 220, the remaining photoresist is removed. According to some specific embodiments, an optional clean step 222 can be performed to clean the trench and remove contaminants. The clean step 222 can employ, for example, a conventional wet etching procedure using a mixture containing hydrofluoric acid (HF). The resultant structure is illustrated in FIG. 4A, which shows the silicon substrate 224 with, a pad oxide 226 and a polysilicon layer 228 formed thereon. In one embodiment, pad oxide 226 is about 60 Å thick, and polysilicon layer 228 is about 600 Å thick, although other thicknesses may be used. A CVD ARC 230 overlying polysilicon layer 228 has a thickness of about 1000–2000 Å. The formed trench 232 has a trench bottom and a trench wall 234.

Compared with the conventional approach illustrated in FIGS. 1A–1D, the method of FIG. 3A can eliminate the process of growing a thermal oxide over the surfaces of the trench, which is conventionally used to repair the plasma damage to the silicon substrate during trench formation. The inventors have found that depositing the surface sensitive dielectric material such as $O_3$/TEOS directly over a silicon trench significantly improves the quality of the trench fill layer to be formed over prior approaches and that the clean step 222 can further improve film quality, as discussed in more detail below. In addition, the inventors have discovered that an oxidizing anneal process can be used after formation of the trench fill layer to grow a thermal oxide at the trench bottom and trench wall as discussed below.

In an alternate embodiment shown in FIG. 3B, steps 250 and 252 are the same as steps 202 and 204, respectively. After the polysilicon layer is deposited, a nitride layer, such as LPCVD nitride, is applied over the polysilicon (step 254) and BARC is applied over the nitride layer (step 256). In this embodiment, an additional polysilicon layer is deposited compared to the method depicted in FIGS. 1A–1C. Thereafter, steps 258–268 are the same as steps 212–222 of FIG. 3A and are carried out to etch the trench using the photoresist.

Figure 4B:
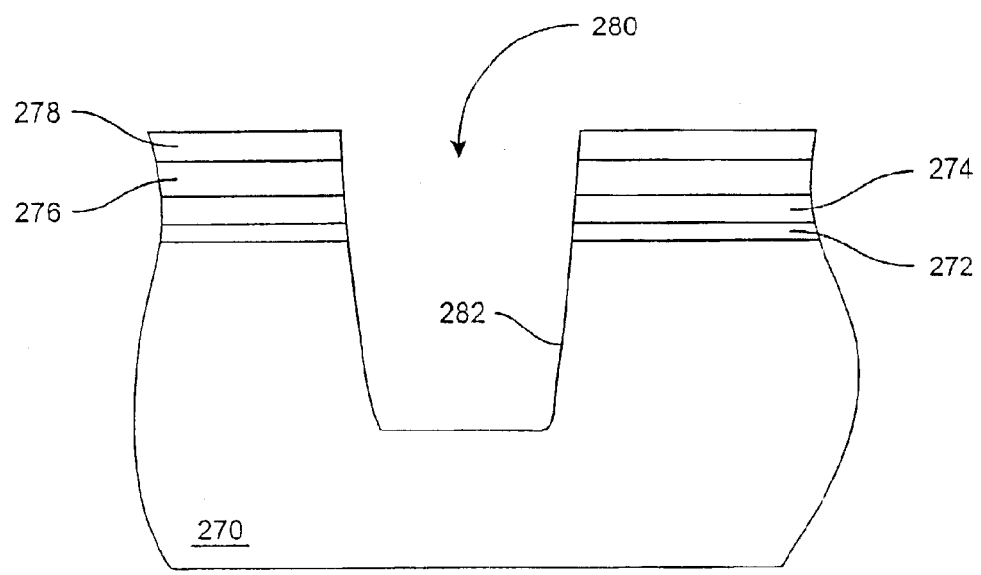

The resultant structure is illustrated in FIG. 4B, which shows a silicon substrate 270 with a pad oxide 272, a polysilicon layer 274, a nitride layer 276 and BARC 278 formed thereon. A trench 280 is etched through layers 272–278 and into silicon substrate 270, defining a trench bottom and a trench wall 282. In contrast to FIG. 1D, thermal oxide is not grown at this stage. A subsequent anneal step operates to form thermal oxide along trench wall 282.

Thereafter, a clean step 266 is advantageously performed using a conventional wet etching process with an HF mixture or the like to remove contaminants. As discussed below, the inventors have discovered that this clean step 266 improves the quality of the trench fill layer that will be deposited. BARC 278 is removed prior to trench fill.

The CVD ARC may be used in specific embodiments of the invention. According to some specific embodiments, subsequent process steps described below may be used whether the CVD ARC/polysilicon/oxide or the BARC/ nitride/polysilicon/oxide combination is used. Therefore, after the formation of the trench, the term "etch stop" layer will be used instead and is understood to represent an LPCVD nitride layer or CVD ARC.

B. Depositing a Trench Fill Layer

Figure 5:
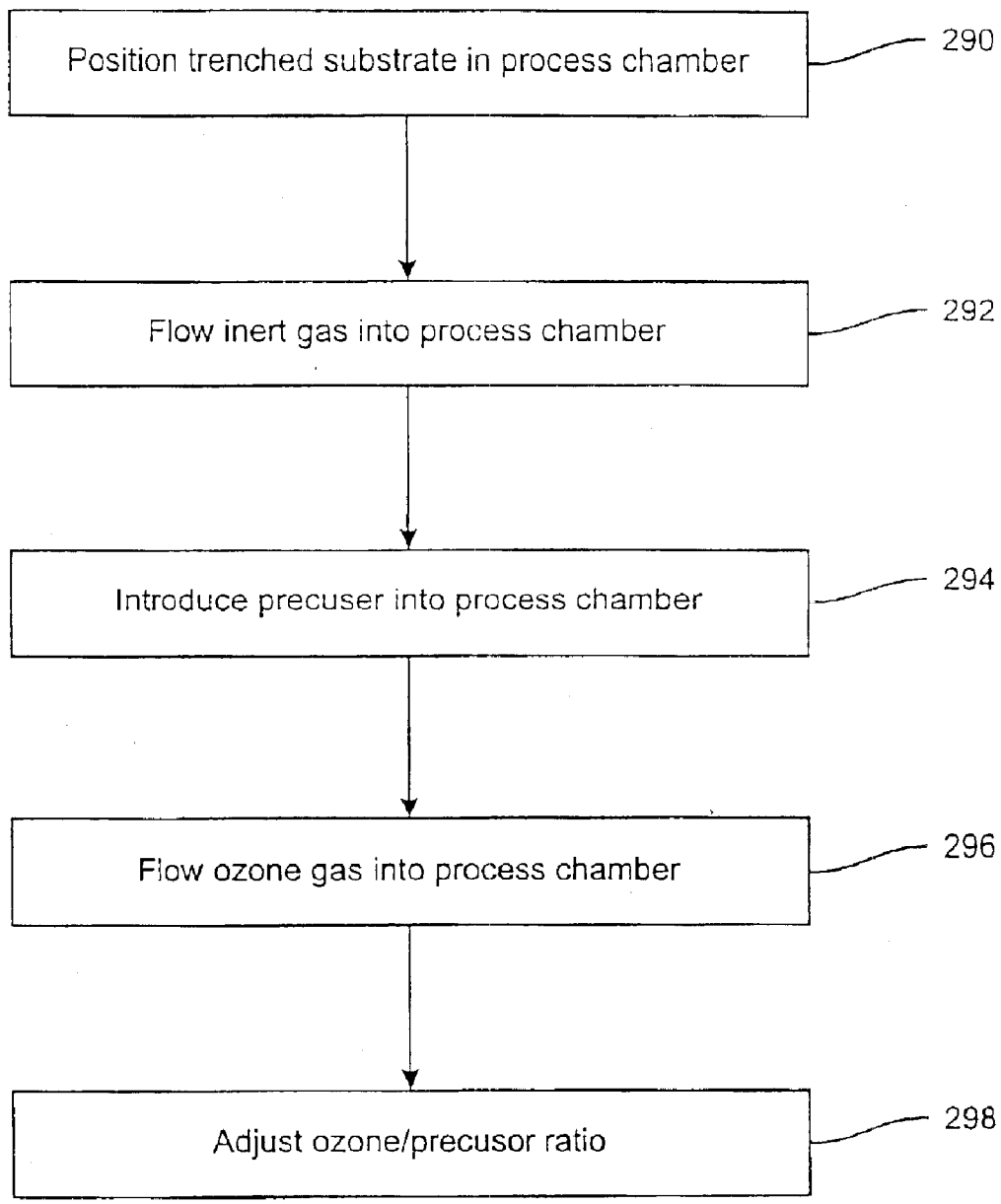
FIG. 5 is a flow diagram of an embodiment of the method of forming a self-planarized trench fill layer formed in accordance with the present invention.

Referring to FIG. 5, after the trenched substrate (224 in FIG. 4A or 270 in FIG. 4B) is prepared, it is placed in a process chamber (such as the chamber 15 of FIG. 10) in step 290. Typically an inert gas is flowed into the chamber in step 292 to stabilize the pressure in the chamber before reactive process gases are introduced. Next, a precursor having a surface sensitivity and growth rate dependence on differently constituted surfaces is introduced into the chamber (step 294). An example of a suitable precursor is TEOS. Because TEOS is a liquid precursor, a suitable apparatus directs the bubbling of a delivery gas, such as helium, through the TEOS in a bubbler assembly or introducing a carrier gas, such as helium or nitrogen, to a liquid injection system to vaporize the TEOS and form a process gas having the desired flow rates. An ozone gas is flowed into the chamber (step 296) to react with the TEOS to deposit an $O_3$/TEOS trench fill layer over the substrate. The deposition rate of the $O_3$/TEOS layer is faster on the lower trench bottom (which is silicon) than on the higher surfaces of the upper portions of the substrate that include the etch stop layer (which is CVD ARC for FIG. 4A and nitride for FIG. 4B). For example, deposition of $O_3$/TEOS layer on silicon and polysilicon proceed at about the same rate. This deposition rate is as much as five times greater than the rate on nitride, for example on the nitride layer in FIG. 4B and CVD ARC in FIG. 4A.

The relative deposition rates of the $O_3$/TEOS layer on the lower and higher surfaces are regulated in step 298 by adjusting the $O_3$/TEOS ratio until the $O_3$/TEOS layer develops a substantially self-planarized dielectric surface. The $O_3$/TEOS ratio can be adjusted by adjusting the flow rates of the $O_3$ and/or TEOS. For instance, a predetermined $O_3$/TEOS ratio can be selected and the relative flow rates are adjusted to achieve that ratio in step 298. It is advantageous to maximize the $O_3$/TEOS ratio to accelerate the deposition from the trench bottom to achieve planarity. $O_3$/TEOS ratios of desirably higher than about 10:1, and more desirably about 10:1 to 20:1, can be used.

The deposition of the trench fill layer can take place at a relatively low temperature of under about 500° C., for example about 300–500° C. This advantageously avoids the undesirable aluminum fluoride formation which may occur when deposition occurs at high temperatures above about 500° C. in processing chambers that include aluminum materials and the longer cleaning time required to remove the aluminum fluoride. Other process parameters such as pressure and flow rates can be adjusted to optimize the deposition process for a selected $O_3$/TEOS ratio. A pressure ranging from about 200 to 700 Torr is preferable for use with $O_3$/TEOS ratios of 10:1 to 20:1.

Figure 6A:
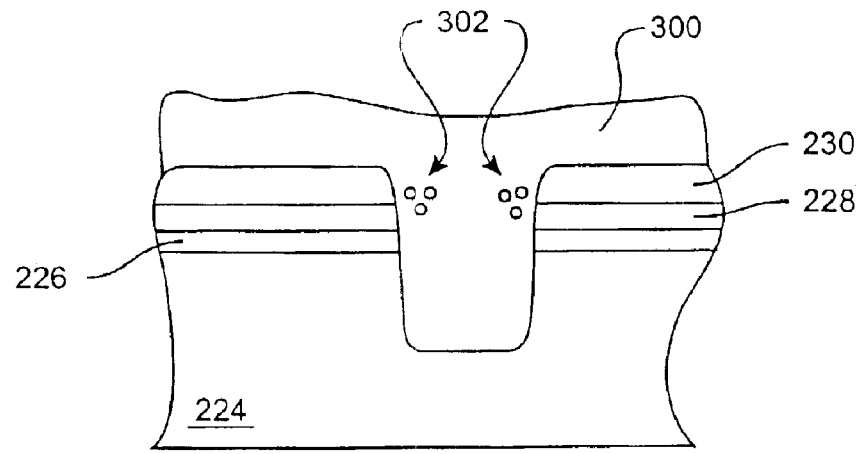
FIGS. 6A and 6B are side cross-sectional views of alternate embodiments of a substrate with a self-planarized trench fill layer in accordance with the present invention.
Figure 6B:
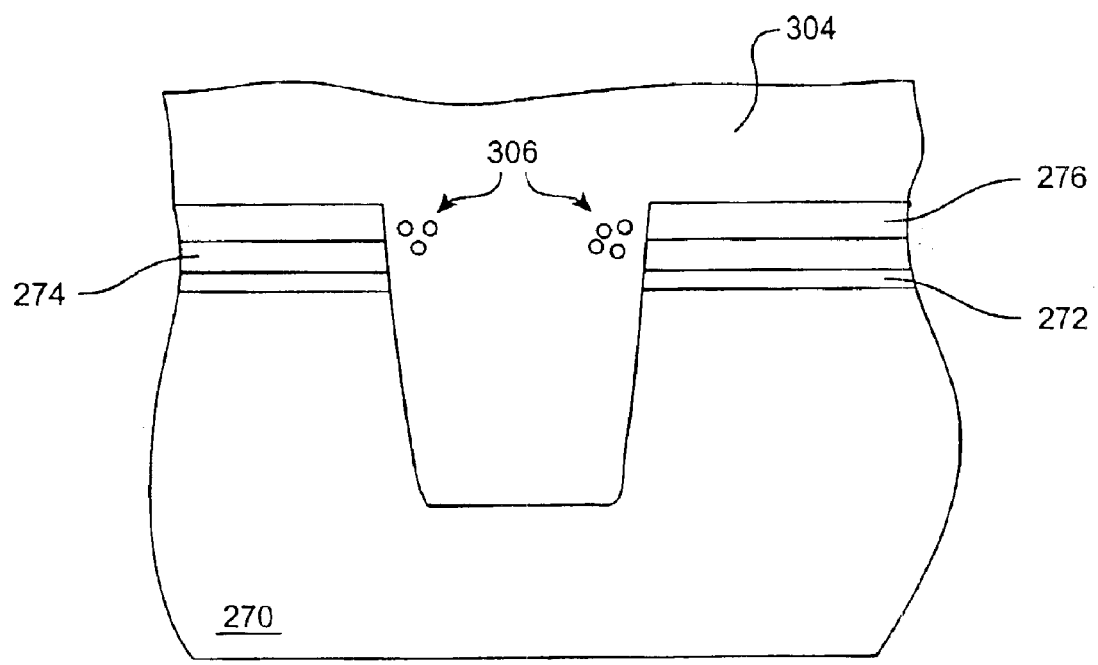

FIGS. 6A and 6B illustrate the self-planarized trench fill dielectric layers 300 and 304, respectively, deposited over the substrates 224, 270 of FIGS. 4A and 4B. While the variance in deposition rates of $O_3$/TEOS due to the underlying surface is used advantageously to create a substantially self-planarized STI structure, trench fill quality issues arise. More specifically, porous regions 302, 306 tend to form adjacent the nitride layer due at least in part to the slower deposition rate thereon. These porous regions lead to the problems discussed in conjunction with FIG. 2. At least part of the present invention is the recognition that the use of polysilicon layers 228, 274 elevate the porous regions away from the trench openings, and hence away from the trench corners. The use of polysilicon is advantageous at least in part due to the similar deposition rates of $O_3$/TEOS on polysilicon and silicon. Further advantages of using polysilicon also are realized in the subsequent anneal process described in conjunction with FIGS. 7 and 8.

Hence, the present methods not only provide self-planarized deposition of the trench fill layers, but also ensure that these layers are of high quality.

C. Processing the Trench Fill Layer

Figure 7:
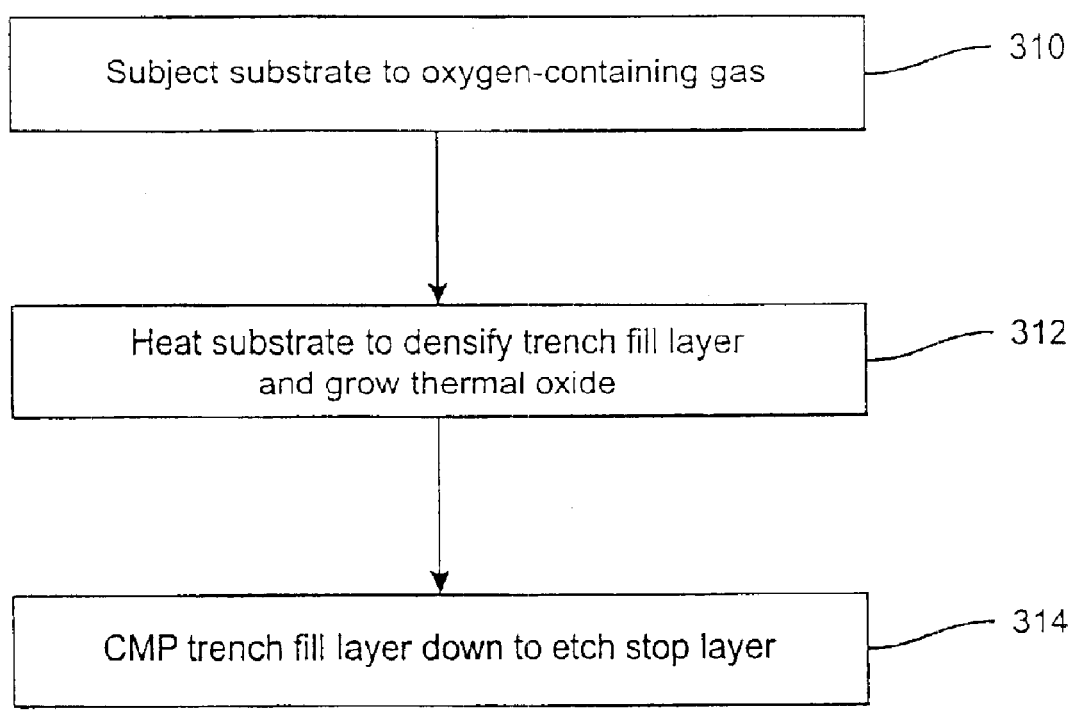
FIG. 7 is a flow diagram of an embodiment of the method of processing a trench fill layer in accordance with the present invention.

Referring to FIG. 7, steps 310 and 312 represent an oxidizing anneal process that can be used to grow a thermal oxide at the trench surfaces after the trenches have been filled with the deposited trench fill layer. Further details may be found in European Patent Application No. 398401232, entitled METHODS FOR FORMING SELF-PLANARIZED DIELECTRIC LAYER FOR SHALLOW TRENCH ISOLATION, filed May 22, 1998, and assigned to the assignee of the present invention, the complete disclosure of which is incorporated herein by reference. While the process has general applicability beyond the STI integration described herein, it has particular advantages in this example because the prior thermal oxide growth (FIG. 1D) has been eliminated to ensure formation of a high quality trench fill layer (e.g., $O_3$/TEOS) and global planarization in the method of FIGS. 3A and 3B. This subsequent oxidizing anneal not only causes a thermal oxide to grow at the trench surfaces, but it substantially simultaneously densifies the trench fill layer, further improving its quality. A dense layer is advantageous, particularly for isolation purposes.

The oxidizing anneal is performed by subjecting the substrate to an oxygen-containing gas in step 310 (such as molecular oxygen, steam, and any precursor with oxygen); and heating the substrate to a suitable temperature (e.g., above about 800° C.) in step 312. In one particular embodiment, the substrate is heated to about 1050° C. in a 100% $O_2$ atmosphere for about 40 minutes. In another embodiment, the substrate is heated to about 850° C. in an atmosphere comprising 60% H$_2$O and 40% nitrogen for about 30 minutes.

Figure 8A:
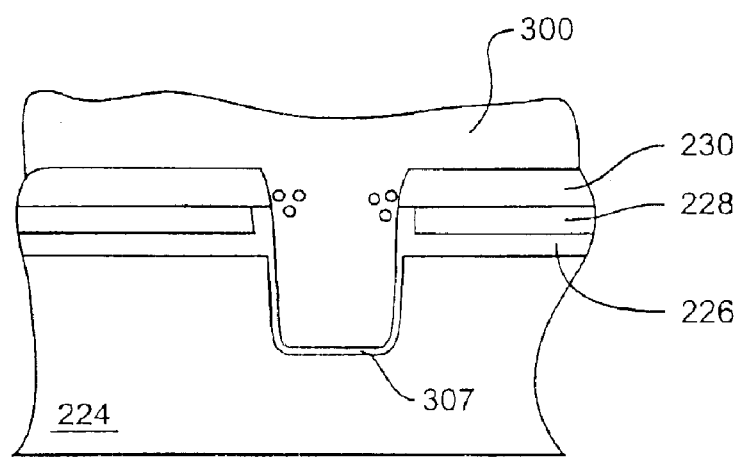
FIGS. 8A and 8B are side cross-sectional views of the substrates of FIGS. 6A and 6B, respectively, which have been processed with an oxidizing anneal in accordance with the present invention.
Figure 8B:
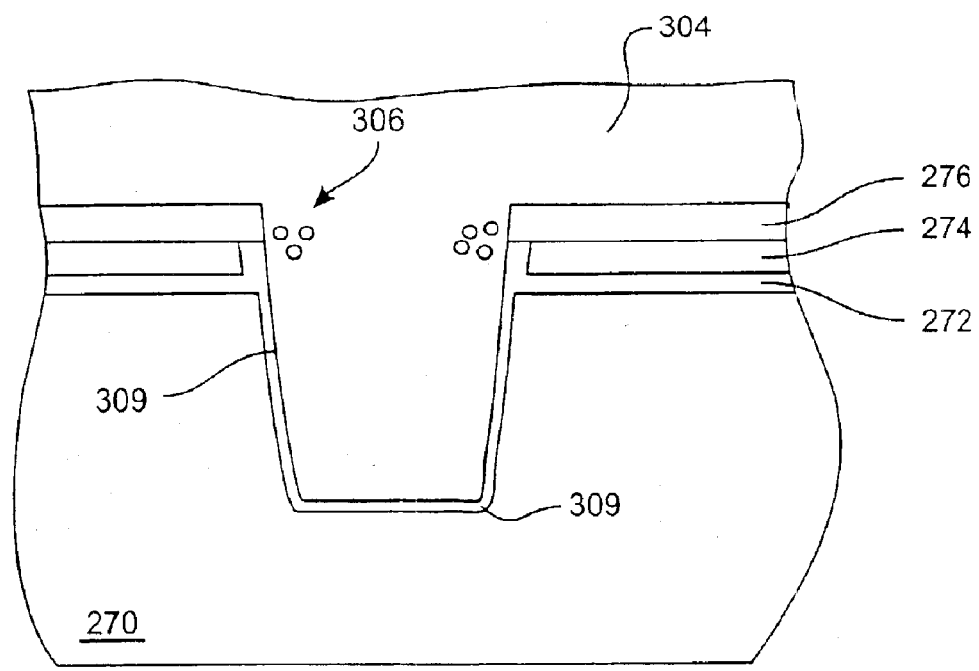

As the substrates 224 and 270 of FIGS. 6A and 6B, respectively, undergo the oxidizing anneal, a thermal oxide 307 and 309 is grown along the surfaces of the trench 232 and 280 as illustrated in FIGS. 8A and 8B. The oxidizing anneal is desirably made before CMP to improve the CMP process, because the surface sensitive deposition is more porous on active areas (LPCVD nitride or CVD ARC) than on the trenches (silicon) as deposited. This difference in film density can be beneficial for the CMP process since the CMP rate will be higher over the active area than over the trenches.

A further advantage of polysilicon is the oxidation rate thereof is about two times as great as that for silicon. As shown in FIGS. 8A and 8B, thermal oxide 307, 309 is approximately twice as thick along the polysilicon layer compared to along the silicon trench surfaces. In this manner, the polysilicon oxidation provides exemplary trench corners of trench fill material.

The final step 314 is to selectively remove and planarize the trench fill material, typically by CMP. This step removes the trench fill material over the etch-stop layer which can be the nitride layer or CVD ARC. Because the dielectric profile is substantially planar, no reverse mask and etch procedure is necessary and the CMP step can be completed more quickly than the case where the dielectric profile is stepped, such as that shown in FIG. 1F. This further decreases process time and increases throughput.

Figure 2A:
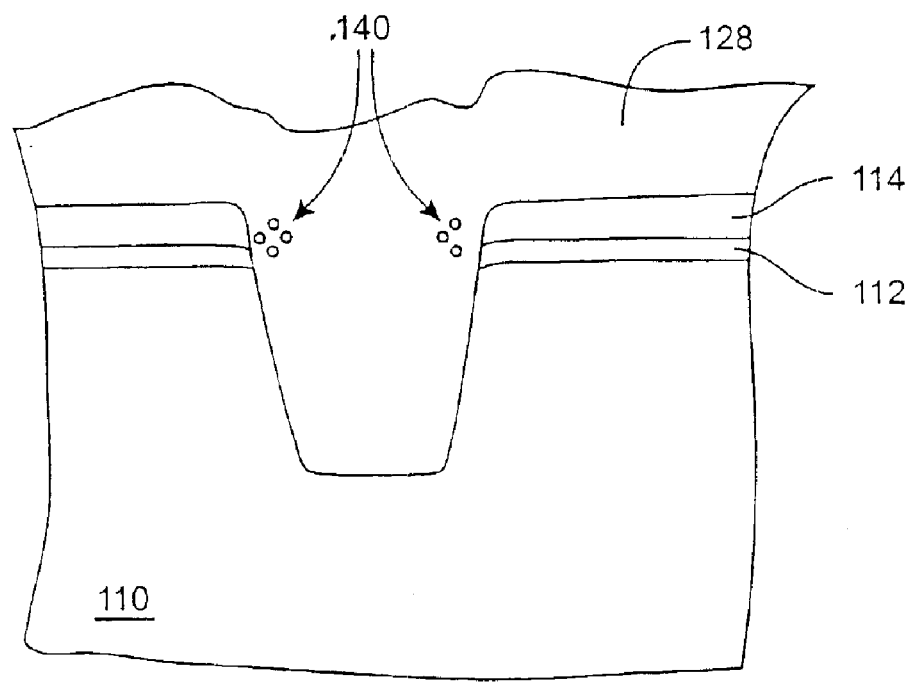
FIGS. 2A and 2B depict side cross-sectional views of trenches having undesirable porous regions before and after CMP.
Figure 2B:
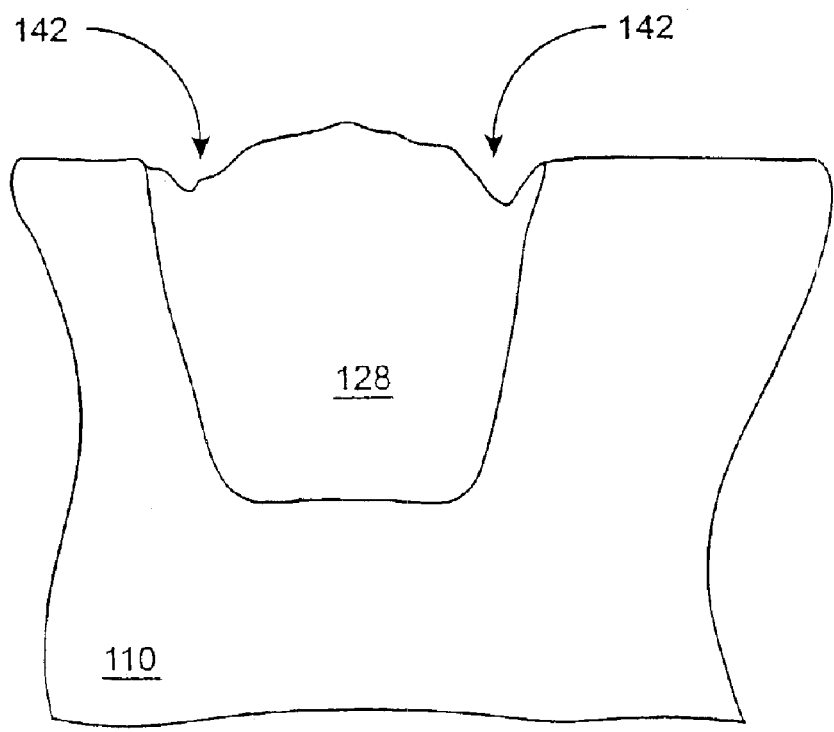
Figure 9A:
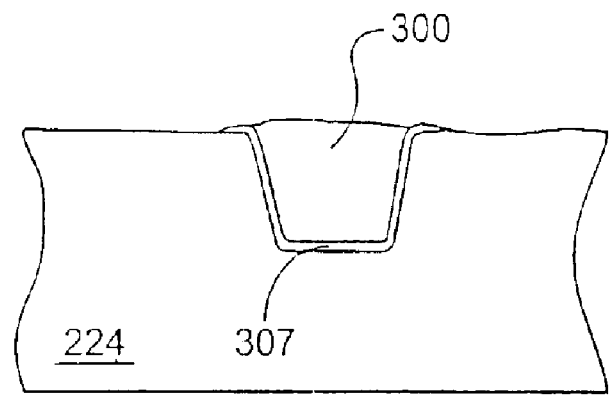
FIGS. 9A and 9B are side cross-sectional views of the substrates of FIGS. 8A and 8B, respectively, after a planarization step in accordance with the present invention.
Figure 9B:
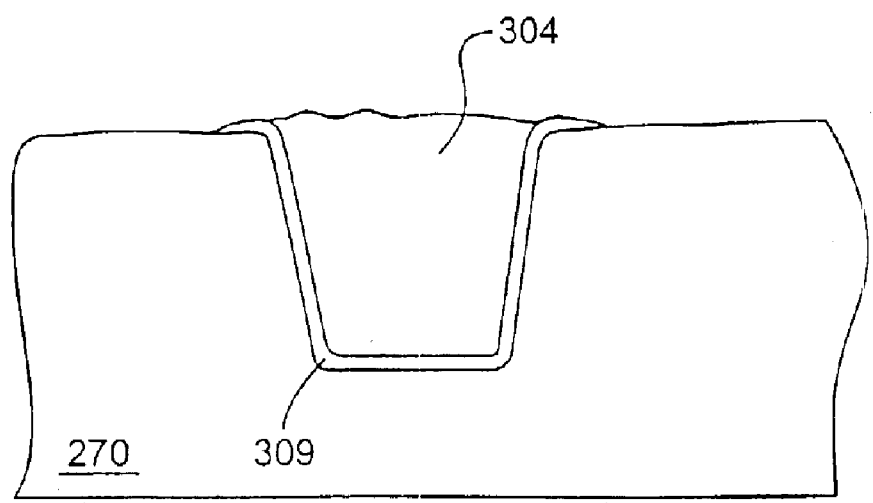

Further, the use of polysilicon layers 228, 274 have elevated porous regions 302, 306 to be further away from the trench openings. As shown in FIGS. 9A and 9B, CMP removes porous regions 302, 306, thereby increasing the consistency of the remaining trench fill dielectric layers 300, 304. Further, exemplary trench corner fill is provided to help avoid electrostatic field over the trench. Hence, problems discussed in conjunction with FIG. 2 are avoided.

II. An Exemplary CVD System

Figure 10:
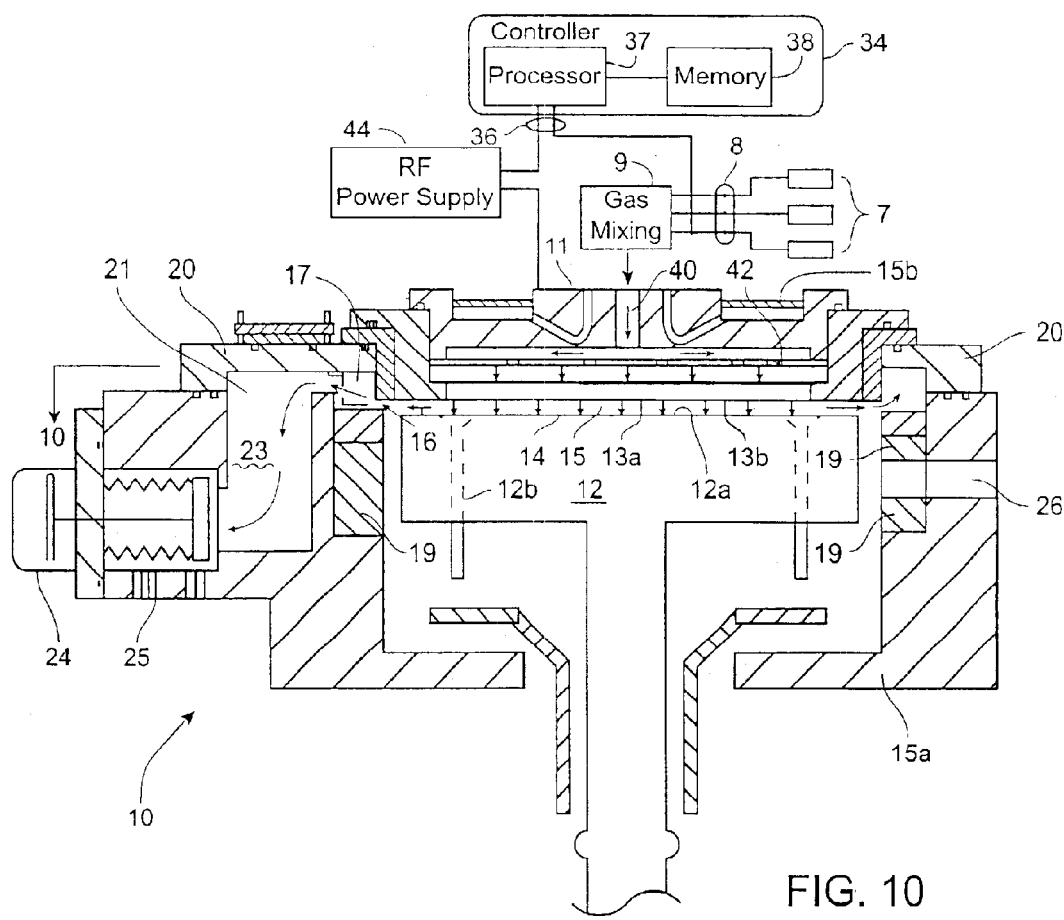
FIG. 10 is a side cross-sectional view of one embodiment of a chemical vapor deposition apparatus according to the present invention.

FIG. 10 depicts one suitable CVD apparatus in which at least portions of the methods of the present invention can be carried out. For example, deposition steps, including deposition of pad oxide, nitride, BARC, CVD ARC, and trench fill dielectrics may be carried out in the system of FIG. 10, or similar systems. Conventional systems known to those skilled in the art may be used for polysilicon deposition, and performing photoresist, etching, and CMP processes in accordance with the present invention.

Figure 11:
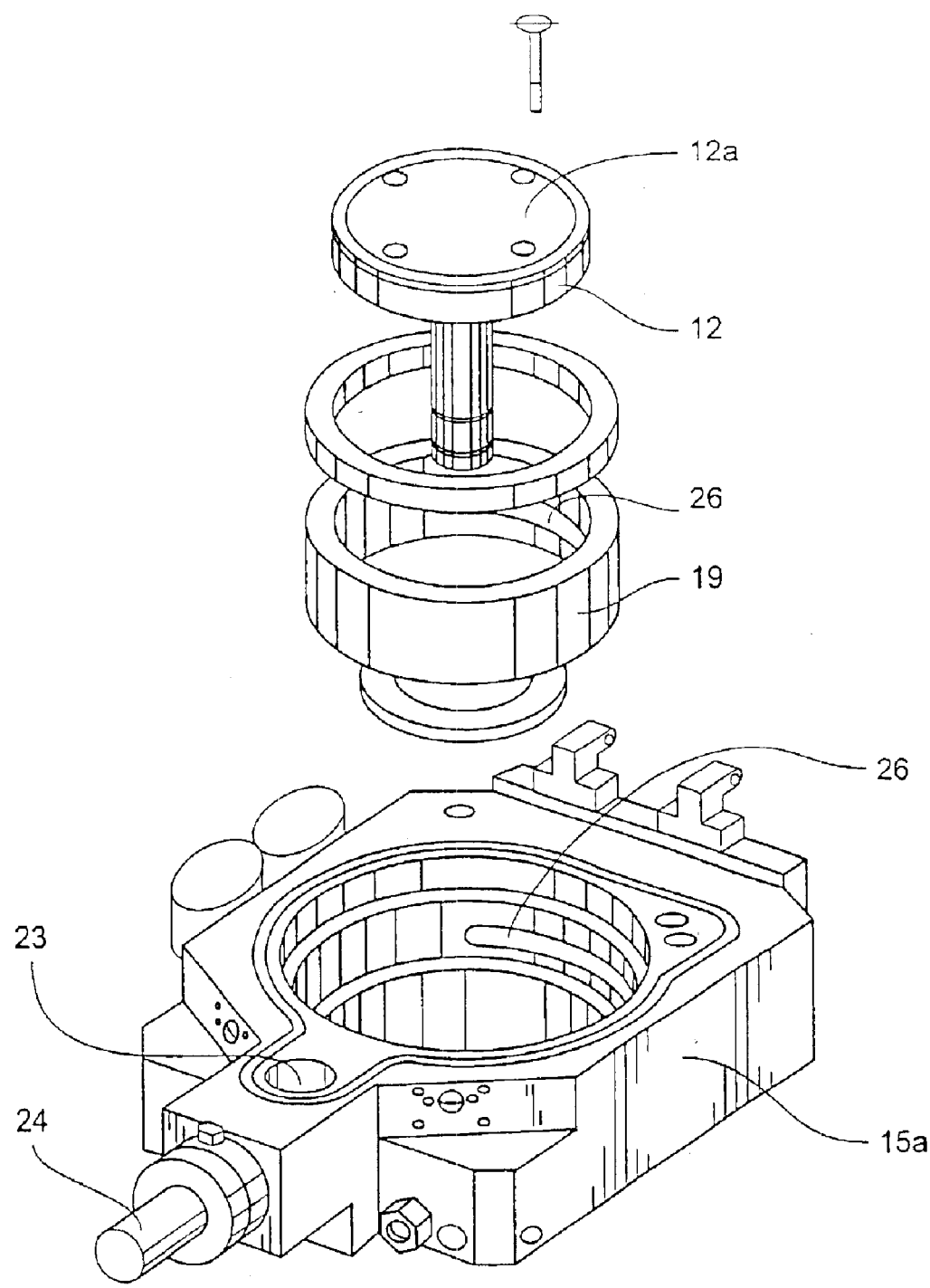
FIGS. 11 and 12 are exploded perspective views of parts of the CVD chamber depicted in FIG. 10.

FIG. 10 shows a vertical, cross-sectional view of a CVD system 10, having a vacuum or processing chamber 15 that includes a chamber wall 15a and chamber lid assembly 15b. Chamber wall 15a and chamber lid assembly 15b are shown in exploded, perspective views in FIGS. 11 and 12. CVD system 10 contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower loading/off-loading position (not shown) and an upper processing position (shown in FIG. 10), which is closely adjacent to manifold 11. A centerboard (not shown) includes sensors for providing information on the position of the wafers.

Deposition and carrier gases are introduced into chamber 15 through perforated holes 13b (FIG. 12) of a conventional flat, circular gas distribution or faceplate 13a. More specifically, deposition process gases flow into the chamber through the inlet manifold 11 (indicated by arrow 40 in FIG. 10), through a conventional perforated blocker plate 42 and then through holes 13b in gas distribution faceplate 13a.

Before reaching the manifold, deposition and carrier gases are input from gas sources 7 through gas supply lines 8 (FIG. 10) into a mixing system 9 where they are combined and then sent to manifold 11. Generally, the supply line for each process gas includes (i) several safety shut-off valves (not shown) that can be used to automatically or manually shut-off the flow of process gas into the chamber, (ii) mass flow controllers (also not shown) that measure the flow of gas through the supply line, and (iii) gas delivery line heating to prevent, for example, liquid condensation therein. When toxic gases (for example, ozone or halogenated gas) are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process or thermal process, a liquid is circulated through the walls 15a of the process chamber to maintain the chamber at a desired temperature, e.g., about 65 degrees Celsius. Fluids used to maintain the chamber walls 15a include the typical fluid types, i.e., water-based ethylene glycol or oil-based thermal transfer fluids. Maintaining the wall temperature beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference.

A lift mechanism and motor (not shown) raises and lowers the heated pedestal assembly 12 and its wafer lift pins 12b as wafers are transferred into and out of the body of the chamber by a robot blade (not shown) through an insertion/removal opening 26 in the side of the chamber 10. The motor raises and lowers pedestal 12 between a processing position 14 and a lower, wafer-loading position. The motor, valves or flow controllers connected to the supply lines 8, gas delivery system, throttle valve, RF power supply 44, and chamber and substrate heating systems are all controlled by a system controller 34 (FIG. 10) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 34.

Figure 12:
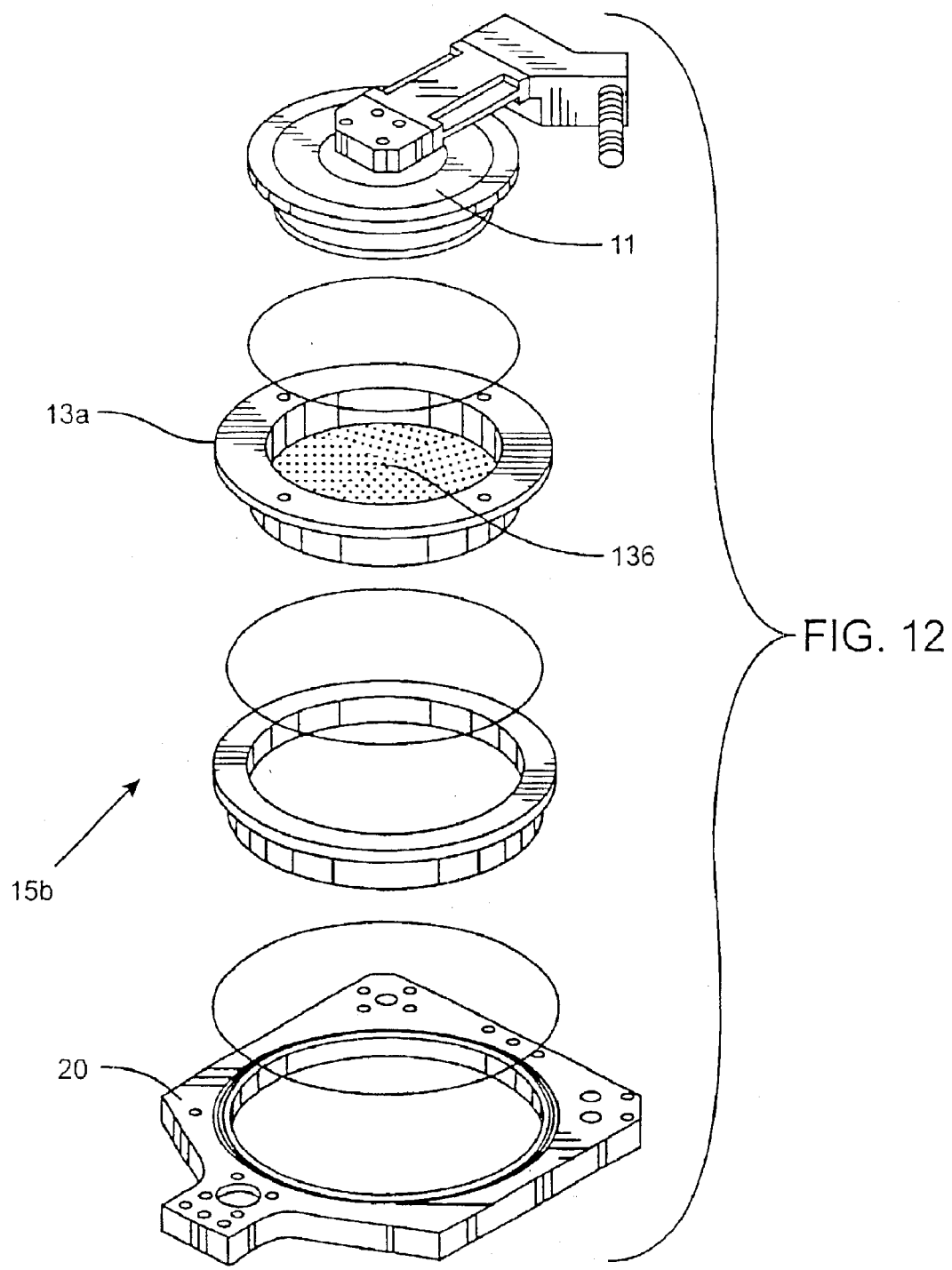
Figure 13:
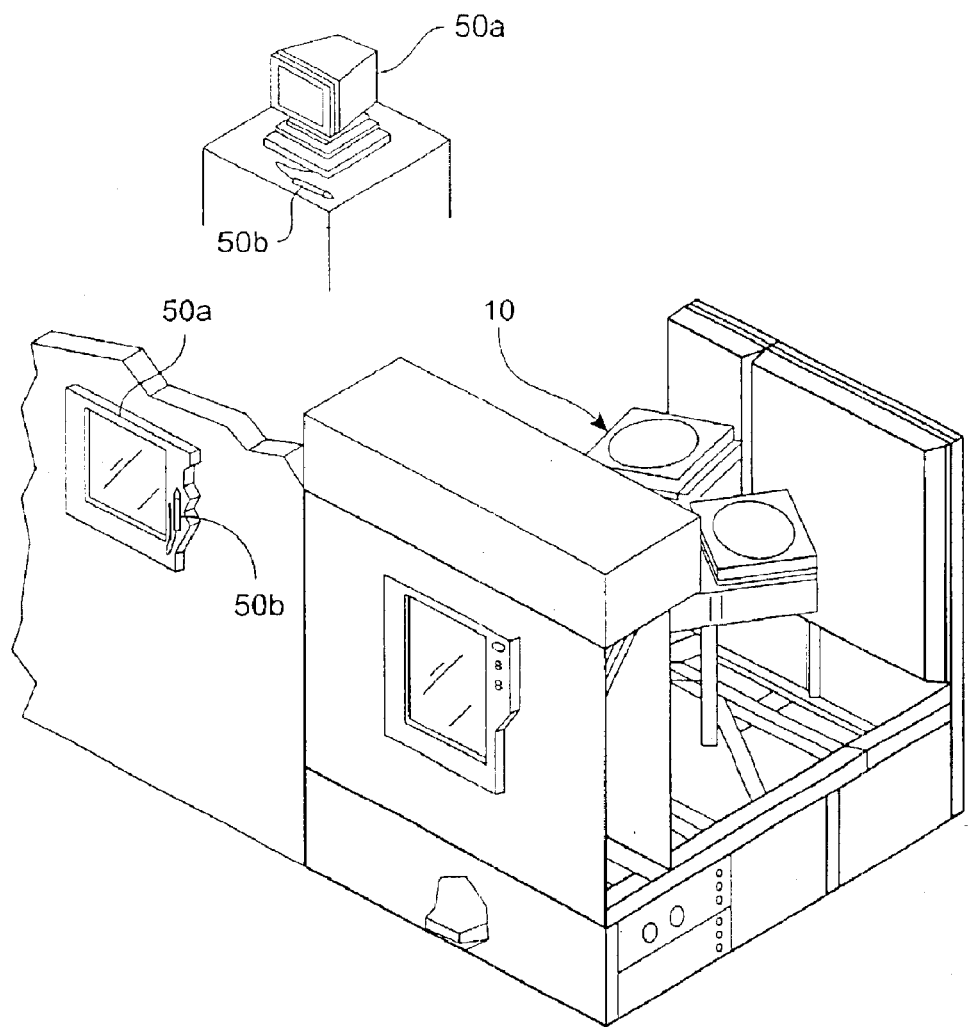
FIG. 13 is a simplified diagram of system monitor and CVD system in a multichamber system, which may include one or more chambers.

The interface between a user and controller 34 is via a CRT monitor 50a and light pen 50b, shown in FIG. 12, which is a simplified diagram of the system monitor and CVD system 10 in a substrate processing system, which may include one or more chambers. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

The present method can be used to improve the global planarization while providing exemplary dielectric film quality due in part to the use of a polysilicon layer to move undesirable porous regions away from the trench. The present method further reduces cost and increases throughput. The oxidizing anneal makes it possible to grow a thermal oxide at the trench surfaces after filling the trenches with a self-planarized, high quality trench fill layer. The oxidizing anneal, coupled with the use of the polysilicon layer, provides improved trench fill quality with exemplary trench corners. The use of CVD ARC for photolithography and CMP purposes to form trenches is more efficient and results in a simpler structure. In addition, alternate embodiments can be devised by, for example, varying the $O_3$/TEOS ratio, pressure, or other parameters for dielectric deposition.

The scope of the invention should, therefore, be determined not with reference to the above description, but instead should be determined with reference to the appended claims along with their full scope of equivalents.

What is claimed is:

1. A method of forming a trench isolation structure on a substrate, the method comprising:
    applying a pad oxide layer on said substrate;
    applying a polysilicon layer over said pad oxide layer;
    applying an anti-reflective coating (ARC) over said polysilicon layer;
    forming a photoresist on said ARC;
    exposing a portion of said photoresist to a light to define a location where a trench is to be formed;
    removing said photoresist at said location;
    etching, at said location, through said ARC, said polysilicon layer, said pad oxide and through a depth of said substrate to form a trench having a trench bottom at said location;
    removing a remainder of the photoresist;
    over filling the trench with a trench fill material, the trench fill material having a porous region located generally adjacent the ARC; and
    removing a portion of the trench fill material including removing the porous region.

2. The method of claim 1 further comprising depositing a nitride layer between said polysilicon layer and said ARC, and wherein said ARC comprises a bottom anti-reflective coating (BARC).

3. A method of forming a trench isolation structure on a substrate, the method comprising:
- applying a pad oxide layer on said substrate;
- applying a polysilicon layer over said pad oxide layer;
- applying a CVD anti-reflective coating (ARC) over said polysilicon layer;
- forming a photoresist on said CVD ARC;
- exposing a portion of said photoresist to a light to define a location where a trench is to be formed;
- removing said photoresist at said location;
- etching, at said location, through said CVD ARC, said polysilicon layer, said pad oxide and through a depth of said substrate to form a trench having a trench bottom at said location;
- removing a remainder of the photoresist;
- over filling the trench with a trench fill material, the trench fill material having a porous region located within the trench and generally adjacent the CVD ARC; and
- removing a portion of the trench fill material including removing the porous region.

4. The method of claim 3 wherein said polysilicon layer is applied with a thickness of about 400 Å to about 1000 Å.

5. The method of claim 3 wherein said CVD ARC is applied with a thickness of about 1000 Å and about 2000 Å.

6. The method of claim 3, wherein said filling step comprises
- introducing a precursor into a substrate processing chamber containing said substrate;
- flowing ozone into said substrate processing chamber to react with said precursor to deposit a dielectric layer over said substrate; and
- adjusting an ozone/precursor ratio between said ozone and said precursor to regulate deposition rates of said dielectric layer on said trench bottom and said CVD ARC until said dielectric layer develops a substantially planar dielectric surface.

7. The method of claim 6 wherein said dielectric layer has a ratio of said ozone to said precursor of about 10:1 to 20:1.

8. The method of claim 6 further comprising:
- subjecting said substrate to an oxygen-containing gas; and
- heating said substrate to substantially simultaneously densify said dielectric layer and to form a thermal oxide at an interface between said dielectric layer and a surface of said trench.

9. The method of claim 3 wherein said removing step is a chemical mechanical polishing (CMP) step.

10. The method of claim 6 further comprising the step of generating a pressure of about 200–700 Torr and a temperature of about 300–500 degrees Celsius in said substrate processing chamber.

11. The method of claim 6 further comprising the step of controlling a pressure in said substrate processing chamber based on an ozone/precursor ratio selected during said adjusting step.

12. A method of forming a trench isolation structure on a substrate, the method comprising:
- applying a pad oxide layer on said substrate;
- applying a polysilicon layer over said pad oxide layer;
- applying a nitride layer over said polysilicon layer;
- applying a bottom anti-reflective coating (BARC) over said nitride layer;
- forming a photoresist on said BARC;
- exposing a portion of said photoresist to a light to define a location where a trench is to be formed;
- removing said photoresist at said location;
- etching, at said location, through said BARC, said nitride layer, said polysilicon layer, said pad oxide and through a depth of said substrate to form said trench at said location;
- removing a remainder of the photoresist;
- filling the trench with a trench fill material, the trench fill material having a porous region located within the trench proximate a trench wall and generally aligned with the nitride layer; and
- removing a portion of the trench fill material including removing the porous region.

13. The method of claim 12 wherein said polysilicon layer is applied with a thickness of about 400 Å to about 1000 Å.

14. The method of claim 12 wherein said nitride layer is applied with a thickness of about 800 Å to about 1200 Å.

15. The method of claim 12, wherein said filling step comprises:
- introducing a precursor into a substrate processing chamber containing said substrate;
- flowing ozone into said substrate processing chamber to react with said precursor to deposit a dielectric layer over said substrate; and
- adjusting an ozone/precursor ratio between said ozone and said precursor to regulate deposition rates of said dielectric layer on said trench bottom and said CVD ARC until said dielectric layer develops a substantially planar dielectric surface.

16. The method of claim 5 further comprising:
- subjecting said substrate to an oxygen-containing gas; and
- heating said substrate to substantially simultaneously densify said dielectric layer and to form a thermal oxide at an interface between said dielectric layer and a surface of said trench.

17. The method of claim 16 wherein said subjecting and heating steps form said thermal oxide to be about 200 Å along a trench wall and about 400 Å along said polysilicon layer.

18. The method of claim 16 wherein said heating step comprises heating said substrate to between about 800 degrees Celsius and about 1100 degrees Celsius, for about 30–40 minutes.

19. The method of claim 12 wherein said removing step is a chemical-mechanical polishing step.

20. The method as in claim 1 wherein the removing of the portion of the trench fill material produces a substantially planar trench fill layer generally devoid of the porous region.

21. The method as in claim 1 wherein overfilling the trench comprises:
- introducing a precursor into a substrate processing chamber containing the substrate;
- flowing ozone into the substrate processing chamber to react with the precursor to deposit the trench fill material over the substrate; and
- adjusting an ozone/precursor ratio between the ozone and the precursor to regulate deposition rates of the trench fill material on the trench bottom and the ARC until a substantially planar dielectric surface of trench fill material forms.

22. The method as in claim 21 wherein the removing of the portion of the trench fill material, including the removing of the porous region, retains a substantially planar dielectric surface of trench fill material.

23. The method as in claim 1 further comprising:
   subjecting the substrate to an oxygen-containing gas; and
   heating the substrate to substantially simultaneously densify a dielectric layer of trench fill material and to form a thermal oxide at an interface between the dielectric layer and a surface of said trench.

24. The method as in claim 23 wherein the subjecting and the heating further forms an increased dielectric layer thickness at the polysilicon layer adjacent a trench corner.

25. The method as in claim 23 wherein the subjecting and the heating is performed prior to the removing of the portion of the trench fill material including the removing of the porous region.

* * * * *